(12) United States Patent
Renaud et al.

(10) Patent No.: US 8,928,084 B2
(45) Date of Patent: Jan. 6, 2015

(54) ESD PROTECTION DEVICE AND METHOD OF FORMING AN ESD PROTECTION DEVICE

(75) Inventors: Philippe Renaud, Cugneaux (FR); Patrice Besse, Toulouse (FR); Amaury Gendron, Toulouse (FR); Nicolas Nolhier, Espanes (FR)

(73) Assignees: Freescale Semiconductor, Inc., Austin, TX (US); Le Centre National de la Recherché Scientifique (CNRS), Paris (FR)

( * ) Notice: Subject to any disclaimer, the term of this patent is extended or adjusted under 35 U.S.C. 154(b) by 873 days.

(21) Appl. No.: 12/598,282

(22) PCT Filed: May 4, 2007

(86) PCT No.: PCT/IB2007/052710
§ 371 (c)(1),
(2), (4) Date: Oct. 30, 2009

(87) PCT Pub. No.: WO2008/135812
PCT Pub. Date: Nov. 13, 2008

(65) Prior Publication Data
US 2010/0127305 A1    May 27, 2010

(51) Int. Cl.
*H01L 23/60*    (2006.01)
(Continued)

(52) U.S. Cl.
CPC ........ *H01L 29/0821* (2013.01); *H01L 27/0259* (2013.01); *H01L 29/0619* (2013.01);
(Continued)

(58) Field of Classification Search
USPC ...................................................... 438/478
See application file for complete search history.

(56) References Cited

U.S. PATENT DOCUMENTS 5,181,091 A  *  1/1993  Harrington et al. ........... 257/355
6,624,481 B1     9/2003  Pendharkar
(Continued)

FOREIGN PATENT DOCUMENTS

EP    1162664 A    12/2001
EP    1396887 A    3/2004

OTHER PUBLICATIONS

International Search Report and Written Opinion correlating to PCT/IB2007/052710 dated Jan. 25, 2008.

(Continued)

*Primary Examiner* — David Vu
*Assistant Examiner* — Jonathan Han

(57) ABSTRACT

An ESD protection device, which is arranged to be active at a triggering voltage (Vt1) for providing ESD protection, comprises a first region of the first conductivity type formed in a semiconductor layer of the first conductivity type, the first region extending from a surface of the semiconductor layer and being coupled to a first current electrode (C) of the semiconductor device, a well region of a second conductivity type formed in the semiconductor layer extending from the surface of the semiconductor layer, and a second region of the second conductivity type formed in the well region, the second region being coupled to a second current electrode (B). The ESD protection device further comprises a floating region of the second conductivity type formed in the semiconductor layer between the first current electrode (C) and the well region and extending from the surface of the semiconductor layer a predetermined depth. The floating region is separated from the well region by a predetermined distance, a value of which is selected such that the floating region is located within a depletion region of a PN junction between the well region and the semiconductor layer when the ESD protection device is active. The floating region has a doping concentration selected such that the floating region is not fully depleted when the ESD protection device is active and the predetermined depth is selected such that the floating region modifies a space charge region near the PN junction. An ESD protection device according to a second embodiment is also disclosed.

20 Claims, 5 Drawing Sheets

(51) Int. Cl.
*H01L 29/08* (2006.01)
*H01L 27/02* (2006.01)
*H01L 29/06* (2006.01)
*H01L 29/10* (2006.01)
*H01L 29/66* (2006.01)
*H01L 29/735* (2006.01)
*H01L 29/78* (2006.01)

(52) U.S. Cl.
CPC ........ *H01L 29/1008* (2013.01); *H01L 29/6625* (2013.01); *H01L 29/735* (2013.01); *H01L 29/66681* (2013.01); *H01L 29/7816* (2013.01)
USPC .... 257/355; 257/107; 257/111; 257/E29.029; 257/173; 438/478

(56) References Cited

U.S. PATENT DOCUMENTS 6,707,110 B2    3/2004   De Heyn et al.
2001/0007521 A1*   7/2001   Chen ................................ 361/56

OTHER PUBLICATIONS

Pendharkar, S. et al., "ESD robust bipolar transistors with variable trigger and sustaining voltages," IEEE ISPSD, Apr. 14-17, 2003, pp. 92-95.

* cited by examiner

US 8,928,084 B2

ESD PROTECTION DEVICE AND METHOD OF FORMING AN ESD PROTECTION DEVICE

FIELD OF THE DISCLOSURE

This disclosure relates to an Electrostatic Discharge (ESD) protection device.

BACKGROUND

Manufacturers of integrated circuits (ICs) are required to take precautions to avoid ESD. The design of ESD protection devices depends on the application or circuit to be protected. Applications, such as automotive applications which require high operating voltages, require high ESD robustness and latch-up free operation and ESD protection devices which can operate at the high operating voltages required in automotive applications.

Typically, ESD protection devices are formed as part of the ICs to protect input/output pads and power pads of the ICs. FIG. 1 shows an IC 2 including an ESD protection device 4 coupled to input/output pads 6 and to a device or devices 8 of the IC. The ESD protection device 4 is arranged to become active at a triggering voltage Vt1 and to remain active at a holding voltage Vh so as to limit voltage spikes or discharge on the input/output pads. The ESD protection device 4 thus prevents overload of and damage to the device or devices 8 of the IC.

FIG. 2 shows a collector current-collector voltage curve 10 of a typical prior art bipolar ESD protection device having a maximum voltage $V_{max}$, at which oxide breakdown occurs, a breakdown voltage $V_b$ at which first breakdown occurs, a triggering voltage Vt1, and a holding voltage Vh. The ESD protection device provides ESD protection in the window between the maximum voltage $V_{max}$ and the supply voltage Vsup. As can be seen from the curve 10, when the voltage reaches the triggering voltage Vt1, the ESD protection device is active and the device snaps back to the holding voltage Vh. Ron is the resistance of the bipolar ESD protection device once the device is active. In order to correctly protect a circuit, Ron is required to be low so that the voltage remains under the maximum voltage Vmax whilst the ESD protection is active.

In some applications, particularly for automotive applications when the ESD protection window between the supply voltage Vsup and the maximum voltage $V_{max}$ is required to be narrow (for example, around 10 volts) in order to prevent latch-up during fast electromagnetic or parasitic transients, there is a further requirement to have an ESD protection device that has no or substantially no snap back. In other words, for some applications it is desirable for the triggering voltage Vt1 to be close to the holding voltage Vh in order to increase the robustness and reliability. For example, in Power Over Ethernet (POE) applications, which specifies for ESD protection a maximum rating of 80 volts and the triggering voltage Vt1 and holding voltage Vh higher than 80 volts, a no snap back ESD protection structure with low on resistance Ron is required.

U.S. Pat. No. 6,707,110 discloses an ESD protection device including a bipolar transistor having an emitter region and base region formed in a weakly doped well region which well region extends a distance d from the emitter region towards the collector region. The ESD protection device further comprises a buried region below the base, emitter and collector regions and thus, the ESD protection device is configured so as to comprise a lateral bipolar transistor and a vertical bipolar transistor. In operation, the holding voltage Vh of the ESD protection device is determined by which of these two transistors snaps back first i.e. which of these two transistors becomes active first when the triggering voltage Vt1 is reached. By varying the distance d, it can be determined which of these two transistors snaps back first and thus, by varying the distance d, the holding voltage Vh can be varied. For lower values of distance d, the holding voltage Vh is determined by the lateral transistor and is lower than for higher values of d when the holding voltage is determined by the vertical transistor. This patent further teaches including an additional high doped region in the weakly doped well region between the emitter and collector region which has the same effect as increasing the distance d. The additional high doped region has the same conductivity type as the weakly doped well region. Although such an arrangement allows for Vh to be increased towards Vt1, by increasing distance d, such an arrangement requires a buried layer in order to realise the vertical bipolar transistor which requires additional manufacturing process steps and so increases the cost of such ESD protection devices. Furthermore, the ESD protection device disclosed in this patent does not allow a holding voltage higher than a value set by the vertical transistor. The value cannot be adjusted in a given technology and is generally too low for protecting high voltage I/O pads. In other words, an arrangement having a buried region, which provides a vertical transistor in operation, is not suited to high voltage applications.

European patent application no. EP 1396887 discloses an ESD protection device comprising a bipolar transistor device and at least one floating region between the emitter and collector regions of the bipolar transistor device. The triggering voltage Vt1 of such a device depends on the doping concentration of semiconductor layer in which the emitter, collector and floating regions are formed and the distance between the floating region and the collector region. This patent explains how to adjust the distance to control the triggering voltage Vt1. However, it does not provide any information on methods to control the snap back, the holding voltage and Ron. Thus, the arrangement disclosed in this patent is not suited for applications requiring high voltage and narrow ESD design windows.

An article entitled 'ESD Robust Transistors with Variable Trigger and Sustaining Voltages' by S Pendharkar et al describes an ESD protection structure including two npn bipolar transistors in parallel with a common collector. The I-V curves show no snap back behaviour. However, a partial buried layer is used to adjust the holding voltage Vh and thus, such an arrangement requires additional manufacturing process steps and so increases the cost of such ESD protection devices.

Other ESD protection mechanisms based on MOSFET devices, stacked bipolar transistors, Silicon Controlled Rectifiers (SCR), Bipolar Junction Transistors (BJT), zener diodes are well known. However, these known mechanisms provide ESD protection with snap back and thus, cannot be used in applications requiring very narrow ESD protection windows.

For example, US patent application no. 2001/0007521 describes an ESD protection circuit comprising mainly a BJT having first and second holding voltages and a high triggering current. The second holding voltage is low compared to the first holding voltage. The ESD protection circuit described in this patent application achieves the low second holding voltage at high current by including a floating region in the collector of the BJT, having a conductivity type opposite to that of the collector. The distance between the floating region and the region coupled to the I/O node can be varied to adjust the level of the high current. However, such an ESD protection arrangement has strong snap back and this patent application provides no information on methods to control snap back, Thus, there is a need for an improved ESD protection device.

SUMMARY

The present invention provides an ESD protection device and a method of forming an ESD protection device as described in the accompanying claims.

BRIEF DESCRIPTION OF THE DRAWINGS

An ESD protection device and a method of forming an ESD protection device in accordance with the present disclosure will now be described, by way of example only, with reference to the accompanying drawings in which.

DETAILED DESCRIPTION OF THE DRAWINGS

Figure 1:
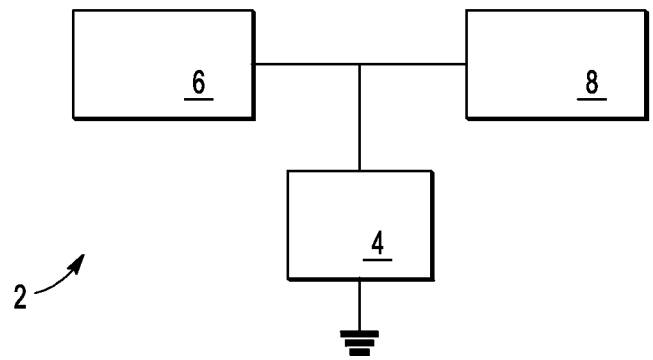
FIG. 1 is a block schematic diagram of an integrated circuit including an ESD protection device.
Figure 2:
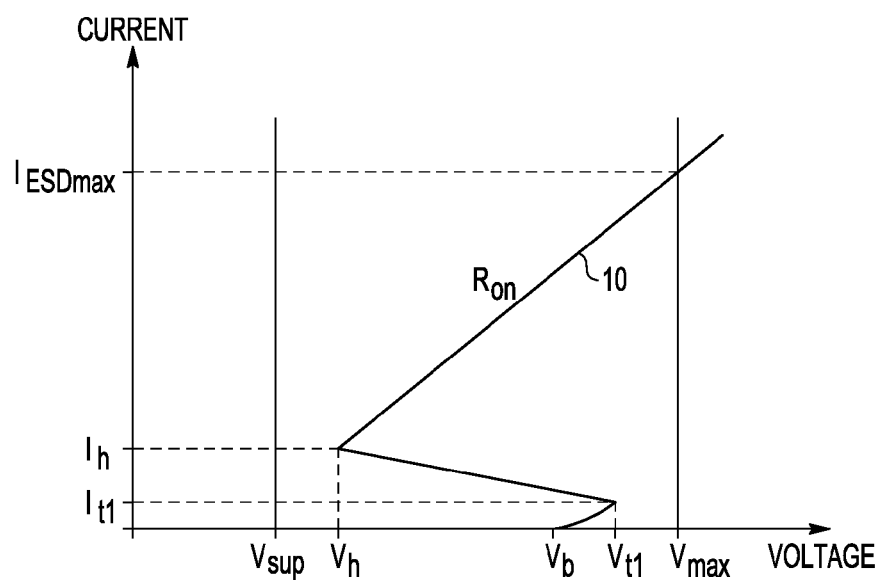
FIG. 2 is a graphical representation of a current versus voltage curve of a typical bipolar ESD device showing typical ESD performance parameters.
Figure 3:
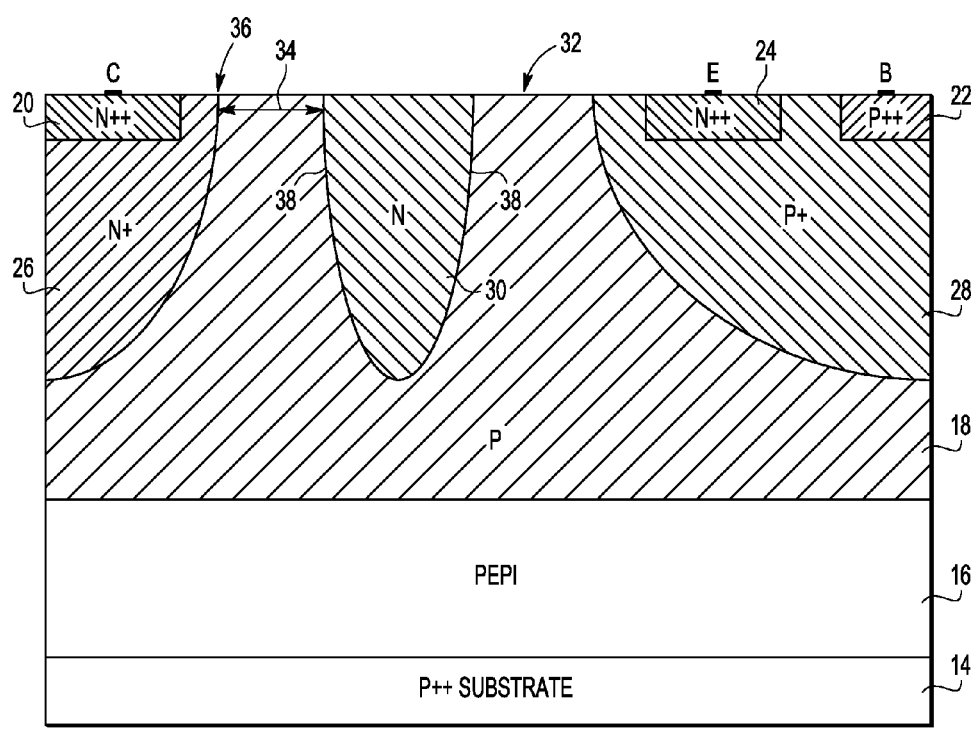
FIG. 3 is a schematic cross-section of an ESD protection device in accordance with an embodiment of the disclosure.
Figure 5:
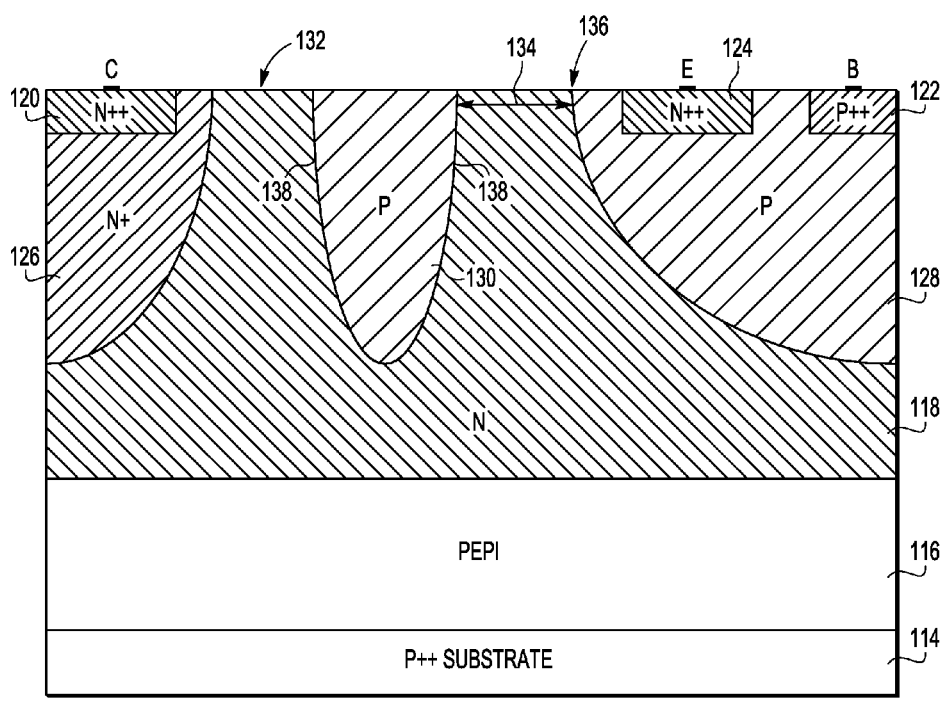
FIG. 5 is a schematic cross-section of an ESD protection device in accordance with another embodiment of the disclosure.

In the description that follows and in FIGS. 3 and 5, certain regions are identified as being of a particular material, conductivity and/or type. However, this is merely for convenience of explanation and not intended to be limiting. Those of skill in the art will understand based on the description given herein that various semiconductor materials can be used and that the doping of various regions of the device may be altered in order to obtain different device functions.

The present disclosure will be described with reference to an ESD protection device comprising a lateral bipolar transistor device such as a lateral npn bipolar transistor device. A lateral transistor device provides current flow mainly in a lateral direction when the device is in an on state. It will be appreciated that the disclosure is not limited to lateral bipolar transistor devices nor lateral npn bipolar transistor devices and applies equally to other lateral semiconductor devices, such as lateral pnp bipolar devices or lateral MOS devices or similar devices.

Referring now to FIG. 3, an ESD protection device in accordance with an embodiment of the disclosure comprises a npn lateral bipolar transistor implemented on a highly doped p-type substrate 14 and a p-type epitaxial layer 16 formed over the substrate 14. The ESD protection device comprises a first highly doped n-type current electrode region 20, a second highly doped p-type current electrode region 22 and a third highly doped n-type current electrode region 24 formed between the first 20 and second 22 current electrode regions. The first 20, second 22, and third 24 regions are formed in a p-type semiconductor layer 18 formed over the epitaxial layer 16 and each region extends from a first surface 32 of the semiconductor layer 18 into the semiconductor layer 18. The first current electrode region 20 is provided with a collector contact C at the first surface 32 for electrically biasing the first current electrode region 20 and is known as the collector region 20. The second current electrode region 22 is provided with a base contact B at the first surface 32 for electrically biasing the second current electrode region 22 and is known as the base region 22. The third current electrode region 24 is provided with an emitter contact E at the first surface 32 for electrically biasing the third current electrode region 24 and is known as the emitter region 24.

A n-type well region 26 is formed in the semiconductor layer 18 extending from the first surface 32 and the collector region 20 is formed in the n-type well region 26. The doping concentration of the n-type well region 26 is less than the doping concentration of the collector region 20. A p-type well region 28 is formed in the semiconductor layer 18 extending from the first surface 32 and the base region 22 and the emitter region 24 are formed in the p-type well region 28. The doping concentration of the p-type well region 28 is less than the doping concentration of the base region 22.

A n-type floating region 30, which is an unbiased region, is formed in the p-type semiconductor layer 18 extending from the first surface 32. The n-type floating region is formed a distance 34 from the PN junction 36 formed between the n-type well region 26 and the semiconductor layer 18 at the first surface 32.

The ESD protection device is configured so that the n-type floating region 30 is not fully depleted at breakdown or in other words is not fully depleted when the ESD protection device is active. For example, having a n-type floating region 30 with a doping concentration of greater than $10^{17}$ cm$^{-3}$ achieves this condition for most high power technologies.

Furthermore, it is desirable to arrange for the depth of the floating region 30 into the semiconductor layer 18 to be large enough to provide significant modification of the potential distribution or the space charge region near the PN junction 36 and so provide control of the voltage handled at this junction. This results in a significant increase in the static breakdown voltage. Typically, the depth of the floating region 30 is in the same range of order as the n-type well region 26. For example, for advance Smartpower technologies the depth of the floating region 30 may be greater than 1 micron.

One or more additional floating regions may be formed in the semiconductor layer 18 to further increase Vt1 and Vh.

The value of the distance 34 is selected such that the floating region 30 is located within the depletion region of the PN junction 36 formed between the n-type well region 26 and the semiconductor layer 18 when the ESD protection device is active (i.e. once the triggering voltage Vt1 is reached). This allows for the electric field to be split across two PN junctions, the PN junction 36 formed between the n-type well region 26 and the semiconductor layer 18 and the PN junction 38 formed between the floating region 30 and the semiconductor layer 18. The critical electrical field for junction breakdown is therefore also split across the two PN junctions 36 and 38 which results in an increase in the static breakdown voltage and hence the triggering voltage Vt1 of the ESD protection device, as compared to a single PN junction 36 in a device without the floating region.

A brief description of the operation of the ESD protection device of FIG. 3 at breakdown will now be given considering two different example configurations: when distance 34 is 1.0 µm and when distance 34 is 1.3 µm.

The electrical characteristics of the devices with distances 34 equal to 1.0 and 1.3 µm exhibit a soft snap back and two operating modes depending on the level of the current once the device is active. The first operating mode occurs at low current (under 400 mA) at breakdown. The first operating mode can be either highly resistive (i.e. high Ron when the distance 34 is equal to 1.0 μm) or lowly resistive (low Ron when the distance 34 is equal to 1.3 μm). The second operating mode occurs at a high current (above 400 mA) with a moderate $R_{ON}$, which is similar for when the distance 34 is 1.0 and 1.3 μm.

Subsequent to breakdown and at low current, the impact ionization region is located at junction 38 in front of the p-type well region 28 facing the base contact B. Due to the impact ionization additional charge carriers are generated and the corresponding avalanche current is flowing between the collector region 20 and the base region 28. The soft to no-snap back behaviour at low current of the ESD protection device is related to an increase of the electrical field at junction 36 (due to a modification of the space charge region surrounding the floating region 30) which compensates the field decrease at junction 38 (due the contribution of the carriers injected by the emitter to the avalanche current). While the impact ionization is located at junction 38, the Ron is determined by the sum of the contributions linked to these two electric fields (that is, the electric field at junction 38 and the electric field at junction 36), which can lead either to a high Ron value (distance 34 equal to 1.0 μm) or to a low Ron value (distance 34 equal to 1.3 μm).

Once the ESD protection device is active (i.e. once the triggering voltage Vt1 has been reached), the holding voltage is determined by the impact ionization at junction 38 in front of the p-type well region 28. The presence of the floating region 30 within the depletion region of the PN junction 36 after breakdown increases the holding voltage Vh greater than the increase in the breakdown voltage Vb and triggering voltage Vt1 which results in a reduction in the snap back voltage. Thus, when configuring the ESD protection device in accordance with the disclosure, the distance 34 is selected to ensure that when the ESD protection device is active, the floating region 30 is within the depletion region of the PN junction 36.

At high current, the impact ionization region shifts from junction 38 to junction 36, so that the distance 34 has little influence on the electrical characteristics of the device. However, the space charge region still surrounds the floating region 30, which ensures the persistence of a high electric field at junction 38 and thus, a high voltage. The electric characteristic of the device with a distance 34 greater than 1.3 μm exhibits a strong snap back and, at high current, is similar to the electrical characteristic of the device for which the floating region is removed. In that case, the impact ionization is located at junction 36 and, at high current, the floating region is no more surrounded by the space charge region so that the device behaves as if there is no floating region.

As discussed above, by varying the value of the distance 34, the holding voltage Vh and the breakdown voltage and triggering voltage Vt1 is varied. This can be seen clearly in FIG. 4 which shows different collector current vs collector voltage curves for different values of the distance 34 for the ESD protection device shown in FIG. 3 obtained by simulation. The reference curve 40 shows the behaviour of a device without a floating region 30.

Figure 4:
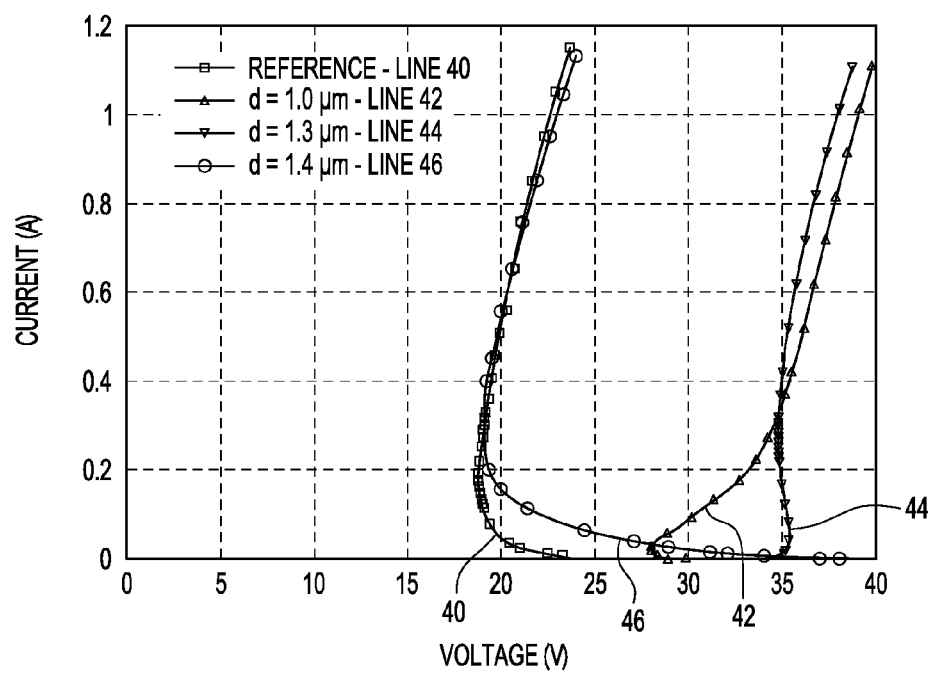
FIG. 4 is a graphical representation of current versus voltage curves of the ESD protection device of FIG. 3 for different values of the distance 34.

Curve 44 in FIG. 4 shows that the snap back voltage (the difference between the triggering voltage Vt1 and the holding voltage Vh) of the ESD protection device shown in FIG. 3 can be reduced to 1 volt. Also, by comparing the gradients of the curves 42-46 with the reference curve 40, it can be seen that the on resistances Ron at high currents are of the same order irrespective of whether there is a floating region 30 or not.

Thus, by adjusting the distance 34, snap back can be reduced and a low on resistance Ron preserved.

FIG. 4 shows that small variations in the distance 34 can lead to a significant modification of the behaviour of the ESD protection device. For example, a 0.1 μm change in the distance 34 which provides a snap back of 1 volt can lead to a completely different behaviour with strong snap back. Thus, when this idea is applied to different manufacturing processes, the variations in the manufacturing technology parameters may lead to undesired results. For example, on different processes, a snap back voltage of 1 volt may not be achievable.

Referring now to FIG. 5, an ESD protection device in accordance with another embodiment of the disclosure comprises a npn lateral bipolar transistor implemented on a highly doped p-type substrate 114 and a p-type epitaxial layer 116 formed over the substrate 114. The ESD protection device comprises a first highly doped n-type current electrode region 120, a second highly doped p-type current electrode region 122 and a third highly doped n-type current electrode region 124 formed between the first 120 and second 122 current electrode regions. The first 120, second 122, and third 124 regions are formed in a n-type semiconductor layer 118 formed over the epitaxial layer 116 and each region extends from a first surface 132 of the semiconductor layer 118 into the semiconductor layer 118. The n-type semiconductor layer 118 is an n-type epitaxial layer. The first current electrode region 120 is provided with a collector contact C at the first surface 132 for electrically biasing the first current electrode region 120 and is known as the collector region 120. The second current electrode region 122 is provided with a base contact B at the first surface 132 for electrically biasing the second current electrode region 122 and is known as the base region 122. The third current electrode region 124 is provided with an emitter contact E at the first surface 132 for electrically biasing the third current electrode region 124 and is known as the emitter region 124.

A n-type well region 126 is formed in the semiconductor layer 118 extending from the first surface 132 and the collector region 120 is formed in the n-type well region 126. The doping concentration of the n-type well region 126 is less than the doping concentration of the collector region 120. A p-type well region 128 is formed in the semiconductor layer 118 extending from the first surface 132 and the base region 122 and the emitter region 124 are formed in the p-type well region 128. The doping concentration of the p-type well region 128 is less than the doping concentration of the base region 122.

A p-type floating region 130, which is an unbiased region, is formed in the n-type semiconductor layer 118 extending from the first surface 132. The p-type floating region 130 is formed a distance 134 from the PN junction 136 formed between the p-type well region 128 and the semiconductor layer 118 at the first surface 132.

The ESD protection device is configured so that the p-type floating region 130 is not fully depleted at breakdown or in other words is not fully depleted when the ESD protection device is active. For example, having a p-type floating region 130 with a doping concentration of greater than $10^{17}$ cm$^{-3}$ achieves this condition for most high power technologies.

Furthermore, it is desirable to arrange for the depth of the floating region 130 into the semiconductor layer 118 to be large enough to provide significant modification of the potential distribution or the space charge region near the PN junction 136 and so provide control of the voltage handled at this junction. This results in a significant increase in the static breakdown voltage. Typically, the depth of the floating region 130 is in the same range of order as the p-type well region 128. For example, for advance Smartpower technologies the depth of the floating region 30 may be greater than 1 micron.

One or more additional floating regions may be formed in the semiconductor layer 18 to further increase Vt1 and Vh.

The value of the distance 134 is selected such that the floating region 130 is located within the depletion region of the PN junction 136 formed between the p-type well region 128 and the semiconductor layer 118. This allows for the electric field to be split across two PN junctions, the PN junction 136 formed between the p-type well region 128 and the semiconductor layer 118 and the PN junction 138 formed between the floating region 130 and the semiconductor layer 118. The critical electrical field for junction breakdown is therefore also split across the two PN junctions 136 and 138 which results in an increase in the static breakdown voltage and hence the triggering voltage Vt1 of the ESD protection device, as described above.

A brief description of the operation of the ESD protection device of FIG. 5 at breakdown will now be given when distance 134 is selected such the device demonstrates no snap back behaviour. As an example, the distance 134 may be in the range 0.9 μm to 1.3 μm.

A device with a distance 134 between 0.9 and 1.3 μm exhibits no snap back behaviour and two different operating modes: a first operating mode which is a highly resistive mode at low current (under 200-300 mA), and a second operating mode which is a lowly resistive mode at higher current (above 200-300 mA).

Subsequent to breakdown and at low current, the internal state of the device is characterized by a spatial separation between the impact ionization region, located around the junction 138 in front of the n-type well region 126, and the avalanche current flow, which extends under the floating region 130. In that configuration, the electrons injected by the emitter cannot contribute to the carrier generation by avalanche, so that the electrical characteristic does not snap back. The result is a high on resistance Ron as the specific high injection effects linked to an emitter injection current which contributes to the impact ionization region at the base-collector PN junction 138 are lost. The high injection effects are known to help reduce Ron.

At high current, the base push-out, which results in a lateral extension of the electric field from the base region 128, leads to a shift of the space charge region towards the n-type well region 126. In this new configuration, the floating region 130 is no longer inside the space charge region, so that the floating region has no more influence on the I-V characteristic. The ESD protection device thus operates as a simple self-biased NPN bipolar transistor, which has an intrinsically low Ron.

To develop an efficient ESD protection, the doping concentration of the n-type well region 126 has to be selected appropriately. If the concentration is too high, the base push-out will arise at a higher current value and the resulting high resistive mode will lead to an over-voltage condition. If it is too low, the no snap back behaviour is not ensured. Typically, the doping concentration of the n-type well region 126 is around $10^{16}$ cm$^{-3}$.

For an ESD protection device having a distance 134 of 1.4 μm (i.e. outside the example range of 0.9 to 1.3 μm), the electrical characteristic strongly snap backs just after the triggering due to the formation of a new impact ionization region at junction 136 which means the ESD protection device may support the same current at a lower voltage.

As discussed above, by varying the value of the distance 134, the holding voltage Vh and the breakdown voltage and triggering voltage Vt1 is varied. By selecting an appropriate value for the distance 134, it can be arranged such that the holding voltage Vh increases by a greater amount than the triggering voltage Vt1 which results in a reduction in the snap back voltage. This can be seen clearly in FIG. 6 which shows different collector current vs collector voltage curves 140-150 for different values of the distance 134 for the ESD protection device of FIG. 5. The reference curve 140 shows the behaviour of a device without a floating region 130.

Figure 6:
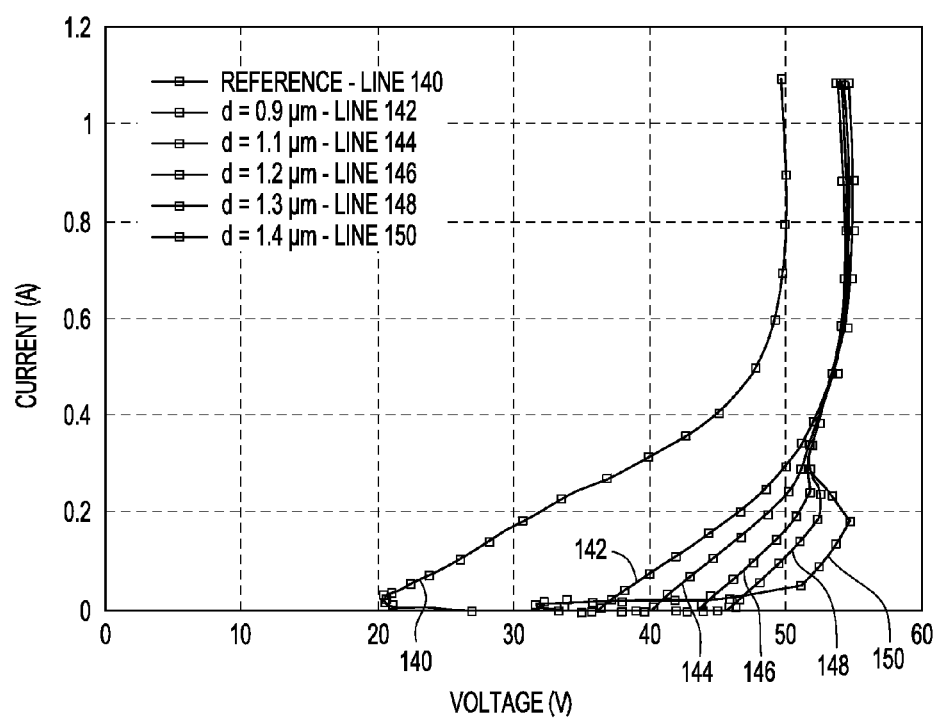
FIG. 6 is a graphical representation of current versus voltage curves of the ESD protection device of FIG. 5 for different values of the distance 134.

Curves 142-148 in FIG. 6 show that there is no snap back of the ESD protection device as shown in FIG. 5. Also, by comparing the gradients of the curves 142-150 with the reference curve 140, it can be seen that the on resistance Ron at high currents is the same with or without a floating region 130. Thus, by adjusting the distance 134 of the ESD protection device shown in FIG. 5, the triggering voltage Vt1 or the breakdown voltage Vb can be varied, a low to negative on resistance Ron is achieved but there is no snap back.

Methods for forming an ESD protection device according to the disclosure are well known in the art. Such methods typically comprise providing a substrate, forming epitaxial layers over the substrate, using masks and implanting dopants to form the well regions and the collector, emitter and base regions, including implanting a p-type material, such as boron (B11+), to form p-type regions and n-type material, such as, arsenic, bismuth, or phosphorus, to from n-type regions, and performing thermal drive steps to drive the doped regions into the semiconductor device. The floating region may be formed with the same process steps (e.g. the same mask) as the well region 26 for the embodiment of FIG. 3 and as the well region 128 for the embodiment of FIG. 5.

In summary, the ESD protection device in accordance with the disclosure enables the I-V characteristics of the device to be adjusted easily between a device with snap back and a device with no snap back, but with the Ron unchanged. By selecting the appropriate layout of the ESD protection device a high triggering voltage can be obtained with low Ron and no snap back.

Since the ESD protection device in accordance with the disclosure can be arranged to have no snap back, external transient stress, such as electromagnetic parasitics, is unlikely to trigger the ESD protection device and so cause latch-up. Thus, the ESD protection device in accordance with the disclosure provides improved electromagnetic and parasitic integrity (EMI).

The invention claimed is:

1. An ESD protection device arranged to be active at a triggering voltage (Vtl) for providing ESD protection, the ESD protection device comprising:
   a semiconductor layer of a first conductivity type;
   a first region of the first conductivity type formed in the semiconductor layer, the first region extending from a surface of the semiconductor layer;
   a well region of a second conductivity type formed in the semiconductor layer extending from the surface of the semiconductor layer;
   a second region of the second conductivity type formed in the well region, the second region being coupled to a second current electrode (B) of the semiconductor device;
   a third region of the first conductivity type formed in the well region, the third region being coupled to a third current electrode (E) of the semiconductor device;
   a fourth region of the first conductivity type formed in the first region, the fourth region being coupled to a first current electrode de (C) of the semiconductor device; and a floating region of the second conductivity type formed in the semiconductor layer between the first current electrode (C) and the well region and extending from the surface of the semiconductor layer a predetermined depth, the floating region being separated from the well region by a predetermined distance, a value of the predetermined distance causes the floating region to be located within a depletion region of a PN junction between the well region and the semiconductor layer when the ESD protection device is active, wherein the floating region has a doping concentration greater than $10^{17}$ cm$^{-3}$ and the doping concentration causes the floating region to not be fully depleted when the ESD protection device is active and wherein the predetermined depth is such that the floating region modifies a space charge region near the PN junction.

2. The ESD protection device according to claim 1, wherein the well region extends into the semiconductor layer a first depth from the surface and wherein the predetermined depth is substantially the same as the first depth.

3. The ESD protection device according to claim 1, further comprising a well region of the first conductivity type formed in the semiconductor layer and extending from the surface so as to surround the first region, wherein the semiconductor layer has a first doping concentration and the well region has a second doping concentration, the first doping concentration being less than the second doping concentration.

4. The ESD protection device according to claim 3, wherein the well region extends into the semiconductor layer a first depth from the surface and wherein the predetermined depth is substantially the same as the first depth.

5. The ESD protection device according to claim 1, wherein the ESD protection device exhibits a soft snap back based on the predetermined distance.

6. The ESD protection device according to claim 5, wherein the soft snap back is a small difference between the triggering voltage of the ESD protection device and a holding voltage of the ESD protection device.

7. The ESD protection device according to claim 2, wherein the ESD protection device to exhibit a soft snap back based on the predetermined distance.

8. The ESD protection device according to claim 7, wherein the soft snap back is a small difference between the triggering voltage of the ESD protection device and a holding voltage of the ESD protection device.

9. An ESD protection device arranged to be active at a triggering voltage (Vt1) for providing ESD protection, the ESD protection device comprising:
a semiconductor layer of a second conductivity type;
a well region of a first conductivity type formed in the semiconductor layer extending from a surface of the semiconductor layer, the well region being coupled to a first current electrode (C) of the semiconductor device;
a second region of the second conductivity type formed in the semiconductor layer, the second region being coupled to a second current electrode (B) region of the semiconductor device;
a third region of the first conductivity type extending from the surface of the semiconductor layer
a fourth region of the first conductivity type formed in the third region, the fourth region being coupled to a third current electrode (E); and
a floating region of the first conductivity type formed in the semiconductor layer between the well region and the third current electrode (E) and extending from the surface of the semiconductor layer a predetermined depth, the floating region being separated from the well region by a predetermined distance, a value of the predetermined distance causes the floating region to be located within a depletion region of a PN junction between the well region and the semiconductor layer when the ESD protection device is active, wherein the floating region has a doping concentration greater than $10^{17}$ cm$^{-3}$, and the doping concentration causes the floating region to not be fully depleted when the ESD protection device is active and wherein the predetermined depth is such that the floating region modifies a space charge region near the PN junction.

10. The ESD protection device according to claim 9, wherein the well region extends into the semiconductor layer a first depth from the surface and wherein the predetermined depth is substantially the same as the first depth.

11. The ESD protection device according to claim 9, further comprising a well region of the second conductivity type formed in the semiconductor layer and extending from the surface so as to surround the second and third regions, wherein the semiconductor layer has a first doping concentration and the well region has a second doping concentration, the first doping concentration being less than the second doping concentration.

12. The ESD protection device according to claim 11, wherein the well region extends into the semiconductor layer a first depth from the surface and wherein the predetermined depth is substantially the same as the first depth.

13. The ESD protection device according to claim 9, wherein the ESD protection device to exhibit a soft snap back based on the predetermined distance.

14. The ESD protection device according to claim 13, wherein the soft snap back is a small difference between the triggering voltage of the ESD protection device and a holding voltage of the ESD protection device.

15. The ESD protection device according to claim 10, wherein the ESD protection device to exhibit a soft snap back based on the predetermined distance.

16. The ESD protection device according to claim 15, wherein the soft snap back is a small difference between the triggering voltage of the ESD protection device and a holding voltage of the ESD protection device.

17. A method of forming an electrostatic discharge (ESD) protection device arranged to be active at a triggering voltage for providing ESD protection, the method comprising:
providing a semiconductor layer of a first conductivity type;
forming a first region of the first conductivity type in the semiconductor layer, the first region extending from a surface of the semiconductor layer;
forming a well region of a second conductivity type in the semiconductor layer extending from the surface of the semiconductor layer;
forming a second region of the second conductivity type in the well region, the second region abutting a second current electrode of the semiconductor device;
forming a third region of the first conductivity type in the well region, the third region abutting a third current electrode of the semiconductor device;
forming a fourth region of the first conductivity type formed in the first region, the fourth region abutting a first current electrode of the semiconductor device; and
forming a floating region of the second conductivity type in the semiconductor layer between the first current electrode and the well region, wherein
the floating region extends from the surface of the semiconductor layer a predetermined depth;

the floating region is a predetermined distance from the well region;

the floating region is located within a depletion region of a PN junction, and between the well region and the semiconductor layer when the ESD protection device is active based on a value of the predetermined distance, wherein the ESD protection device exhibits a soft snap back based on the predetermined distance; and the floating region has a doping concentration greater than $10^{17}$ cm$^{-3}$, the doping concentration causing the floating region to not be fully depleted when the ESD protection device is active and wherein the predetermined depth is such that the floating region modifies a space charge region near the PN junction.

18. The method of claim 17, wherein the soft snap back is a small difference between the triggering voltage of the ESD protection device and a holding voltage of the ESD protection device.

19. The method of claim 17, wherein the well region extends into the semiconductor layer a first depth from the surface and wherein the predetermined depth is substantially the same as the first depth.

20. The method of claim 17, further comprising:

forming a well region of the second conductivity type in the semiconductor layer; and extending the well region of the second conductivity type from the surface so as to surround the second and third regions, wherein the semiconductor layer has a first doping concentration and the well region has a second doping concentration, the first doping concentration being less than the second doping concentration.

* * * * *